United States Patent
Chiron et al.

(10) Patent No.: US 9,948,350 B2
(45) Date of Patent: Apr. 17, 2018

(54) MULTI-MODE RADIO FREQUENCY CIRCUITRY

(71) Applicant: Qorvo US, Inc., Greensboro, NC (US)

(72) Inventors: Jean-Frederic Chiron, Tournefeuille (FR); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/639,121

(22) Filed: Jun. 30, 2017

(65) Prior Publication Data

US 2018/0013465 A1    Jan. 11, 2018

Related U.S. Application Data

(60) Provisional application No. 62/359,180, filed on Jul. 6, 2016.

(51) Int. Cl.

| | |
|---|---|
| *H01Q 11/12* | (2006.01) |
| *H04B 1/04* | (2006.01) |
| *H04B 1/48* | (2006.01) |
| *H03L 7/085* | (2006.01) |
| *H03F 3/193* | (2006.01) |
| *H03F 1/30* | (2006.01) |
| *H03G 3/30* | (2006.01) |
| *H03F 3/16* | (2006.01) |

(52) U.S. Cl.
CPC ............... *H04B 1/48* (2013.01); *H03F 1/306* (2013.01); *H03F 3/16* (2013.01); *H03F 3/1935* (2013.01); *H03G 3/30* (2013.01); *H03L 7/085* (2013.01)

(58) Field of Classification Search
CPC ... H04B 1/48; H03F 1/306; H03F 3/16; H03F 3/1935; H03G 3/30; H03L 7/085
See application file for complete search history.

(56) References Cited

U.S. PATENT DOCUMENTS

| | | | |
|---|---|---|---|
| 9,526,693 B2 | 12/2016 | Rana | |
| 2014/0218109 A1* | 8/2014 | Wimpenny | H03F 3/217 330/251 |
| 2016/0087656 A1* | 3/2016 | Park | H04B 1/006 455/168.1 |
| 2016/0094254 A1* | 3/2016 | Ripley | H04B 1/0475 455/114.3 |
| 2016/0173031 A1* | 6/2016 | Langer | H03F 1/0205 330/126 |
| 2016/0181995 A1* | 6/2016 | Nentwig | H03F 3/211 330/295 |
| 2016/0190995 A1* | 6/2016 | Penticoff | H03F 3/191 330/295 |

* cited by examiner

*Primary Examiner* — Nguyen Vo
(74) *Attorney, Agent, or Firm* — Withrow & Terranova, P.L.L.C.

(57) ABSTRACT

Circuitry includes a first RF power amplifier, a second RF power amplifier, a third RF power amplifier, a first bias signal generator, and a second bias signal generator. The first RF power amplifier and the second RF power amplifier are each configured to amplify RF signals for transmission in a first carrier network. The third RF power amplifier is configured to amplify RF signals for transmission in a second carrier network. In a first mode, the first bias signal generator provides a bias signal to the first RF power amplifier and the second bias signal generator provides a bias signal to the second RF power amplifier. In a second mode, the first bias signal generator and the second bias signal generator each provide a portion of a bias signal to the third RF power amplifier.

20 Claims, 3 Drawing Sheets

MULTI-MODE RADIO FREQUENCY CIRCUITRY

RELATED APPLICATIONS

This application claims the benefit of provisional patent application Ser. No. 62/359,180, filed Jul. 6, 2016, the disclosure of which is hereby incorporated herein by reference in its entirety.

FIELD OF THE DISCLOSURE

The present disclosure relates to radio frequency (RF) circuitry, and specifically to multi-mode RF circuitry.

BACKGROUND

Modern wireless communications devices are expected to work across several different carrier networks, many of which may employ different radio frequency (RF) communications technologies. For example, it may be desirable for a wireless communications device to be capable of interfacing second generation (2G), third generation (3G), and fourth generation (4G) carrier networks. The circuitry used for transmission and reception of RF signals in these different carrier networks may be subject to vastly different operational criteria that have thus far necessitated separate hardware. For example, transmission chains for 3G and 4G carrier networks often utilize average power tracking (APT) circuitry or a combination of APT and envelope tracking (ET) circuitry configured to maximize the efficiency of RF transmission. The circuitry used for transmitting RF signals in 3G and 4G carrier networks is generally not capable of providing adequate power for amplification of RF signals in a 2G carrier network. Accordingly, the hardware support for 3G and 4G carrier networks has thus far been implemented separately from that for 2G carrier networks. The size of the separate hardware has often been a prohibitive factor in providing support for all the desired carrier networks, thereby limiting the ability of a wireless communications device to function in some areas.

Accordingly, there is a need for RF circuitry capable of supporting 2G, 3G, and 4G carrier networks while maximizing the efficiency of the RF circuitry.

SUMMARY

The present disclosure relates to radio frequency (RF) circuitry, and specifically to multi-mode RF circuitry. In one embodiment, circuitry includes a first RF power amplifier, a second RF power amplifier, a third RF power amplifier, a first bias signal generator, and a second bias signal generator. The first RF power amplifier and the second RF power amplifier are each configured to amplify RF signals for transmission in a first carrier network. The third RF power amplifier is configured to amplify RF signals for transmission in a second carrier network. In a first mode, the first bias signal generator provides a bias signal to the first RF power amplifier and the second bias signal generator provides a bias signal to the second RF power amplifier. In a second mode, the first bias signal generator and the second bias signal generator each provide a portion of a bias signal to the third RF power amplifier. By using the first bias signal generator and the second bias signal generator to provide a portion of a bias signal to the third RF power amplifier in the second mode, signals may be transmitted in the first carrier network and the second carrier network using only the first bias signal generator and the second bias signal generator.

In one embodiment, the first carrier network is one or more of a third generation (3G) and a fourth generation (4G) carrier network, while the second carrier network is a second generation (2G) carrier network. Transmitting signals in the 2G carrier network takes substantially more power than transmitting signals in a 3G or 4G carrier network. Accordingly, supporting transmission of signals in the 2G carrier network has thus far used separate high power bias signal generator circuitry. Using the first bias signal generator and the second bias signal generator together to provide a bias signal to the third RF power amplifier allows transmission of RF signals in a 2G carrier network without a separate high power bias signal generator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
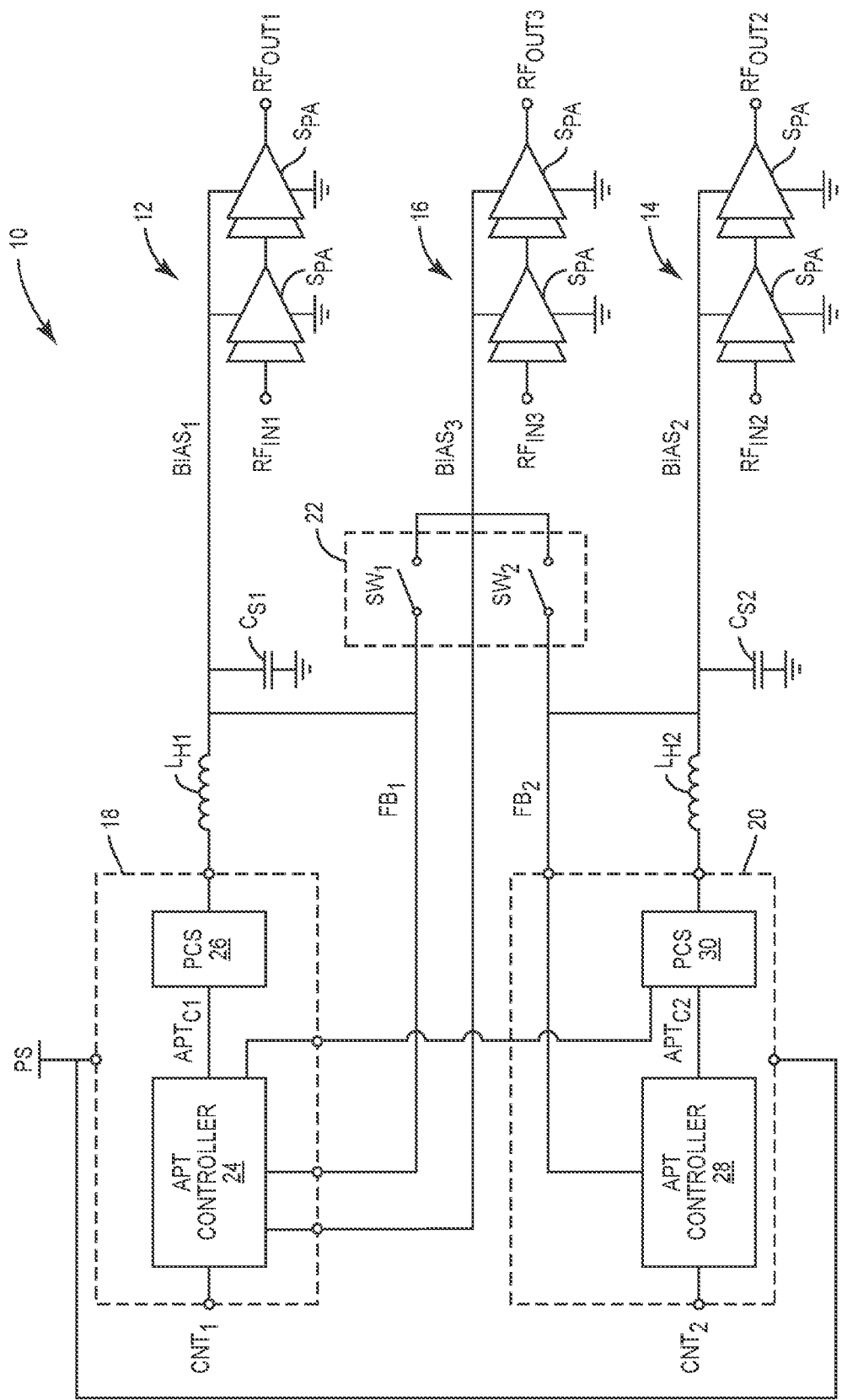
FIG. 1 shows radio frequency (RF) circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows radio frequency (RF) circuitry 10 according to one embodiment of the present disclosure. The RF circuitry 10 includes a first RF power amplifier 12, a second RF power amplifier 14, a third RF power amplifier 16, a first bias signal generator 18, a second bias signal generator 20, and switching circuitry 22. The first RF power amplifier 12 is configured to amplify a first RF input signal $RF_{IN1}$ to provide a first RF output signal $RF_{OUT1}$ and may include one or several power amplifier stages $S_{PA}$. The second RF power amplifier 14 is configured to amplify a second RF input signal $RF_{IN2}$ to provide a second RF output signal $RF_{OUT2}$ and may include one or several power amplifier stages $S_{PA}$. The third RF power amplifier 16 is configured to amplify a third RF input signal $RF_{IN3}$ to provide a third RF output signal $RF_{OUT3}$ and may include one or several power amplifier stages $S_{PA}$. As discussed in detail below, the first RF output signal $RF_{OUT1}$ and the second RF output signal $RF_{OUT2}$ are third generation (3G) or fourth generation (4G) signals suitable for transmission on a 3G or 4G carrier network. The third RF output signal $RF_{OUT3}$ is a second generation (2G) signal suitable for transmission on a 2G carrier network.

The first bias signal generator 18 is configured to receive a power supply signal PS, a first control signal $CNT_1$, and a first feedback $FB_1$ signal and provide a first bias signal $BIAS_1$ as discussed below. Accordingly, the first bias signal generator 18 includes a first average power tracking (APT) controller 24 and a first set of power converter switches 26.

The first APT controller 24 is configured to provide a first APT control signal $APT_{C1}$ to the first set of power converter switches 26, which switch power to a first holding inductor $L_{H1}$ and a first smoothing capacitor $C_{S1}$ to provide a desired bias signal or a portion thereof as discussed below. The first APT control signal $APT_{C1}$ is based on the first feedback signal $FB_1$ and the first control signal $CNT_1$, which may be provided from a serial controller (not shown to avoid obscuring the drawings).

The second bias signal generator 20 is configured to receive the power supply signal PS, a second control signal $CNT_2$, and a second feedback signal $FB_2$ and provide a second bias signal $BIAS_2$ as discussed below. Accordingly, the second bias signal generator 20 includes a second APT controller 28 and a second set of power converter switches 30. The second APT controller 28 is configured to provide a second APT control signal $APTC_2$ to the second set of power converter switches 30, which switch power to a second holding inductor $L_{H1}$ and a second smoothing capacitor $C_{S1}$ to provide a desired bias signal or a portion thereof as discussed below. The second APT control signal $APT_{C2}$ is based on the second feedback signal $FB_2$ and the second control signal $CNT_2$, which may be provided from a serial controller (not shown to avoid obscuring the drawings).

The first RF power amplifier 12 includes a bias input coupled to an output of the first bias signal generator 18. The second RF power amplifier 14 includes a bias input coupled to an output of the second bias signal generator 20. The third RF power amplifier 16 includes a bias input coupled to an output of both the first bias signal generator 18 and the second bias signal generator 20 through the switching circuitry 22. In one embodiment, the first RF power amplifier 12 and the second RF power amplifier 14 are configured to amplify RF signals suitable for transmission in one or more of a 3G carrier network and a 4G carrier network, while the third RF power amplifier is configured to amplify RF signals suitable for transmission in a 2G carrier network. The first bias signal generator 18 and the second bias signal generator 20 are designed to provide bias signals suitable for the first RF power amplifier 12 and the second RF power amplifier 14, respectively, with maximum efficiency. As will be appreciated by those skilled in the art, RF power amplifiers configured to amplify RF signals for transmission in 3G carrier networks and 4G carrier networks consume significantly less power than those configured to amplify RF signals for transmission in 2G carrier networks. For example, RF power amplifiers configured to amplify RF signals for transmission in 2G carrier networks may require two to three times more power than those used to amplify RF signals for transmission in 3G carrier networks and 4G carrier networks. Accordingly, conventional approaches to supporting communication over 2G carrier networks, 3G carrier networks, and 4G carrier networks have thus far required separate bias signal generator circuitry for supporting the 2G carrier networks, which consumes additional area in the RF circuitry 10. Using the same bias signal generator circuitry for supporting all of the carrier networks requires designing the bias signal generator circuitry for the highest power demand, which will significantly reduce the efficiency of the circuitry when operating at lower power levels. As discussed herein, a 2G carrier network may be one or more of a Digital Advanced Mobile Phone System (D-AMPS) carrier network, a Global System for Mobile communication (GSM) carrier network, a General Packet Radio System (GPRS) carrier network, and a first generation Code Division Multiple Access (cdmaOne) carrier network.

A 3G carrier network may be one of a Code Division Multiple Access 2000 (C2k) carrier network, an Evolution Data Optimized (EVDO) carrier network, a Wideband CDMA (WCDMA) carrier network, a High Speed Packet Access+ (HSPA+) carrier network, and a Time Division Synchronous CDMA (TD-SCDMA) carrier network. A 4G carrier network may be one or more of a Long Term Evolution (LTE) and an LTE advanced carrier network.

To address these problems, the switching circuitry 22 is provided, and the RF circuitry 10 is operated in one of a first mode and a second mode. The switching circuitry 22 includes a first switch $SW_1$ coupled between an output of the first bias signal generator 18 and a bias input of the third RF power amplifier 16 and a second switch $SW_2$ coupled between an output of the second bias signal generator 20 and the bias input of the third RF power amplifier 16. In the first mode, the first switch $SW_1$ and the second switch $SW_2$ are open such that the bias input of the third RF power amplifier 16 is isolated. Accordingly, the third RF power amplifier 16 is inactive in the first mode, while one or both of the first RF power amplifier 12 and the second RF power amplifier 14 are active. Specifically, the first RF power amplifier 12 is biased via a first bias signal $BIAS_1$ provided from the first bias signal generator 18 while the second RF power amplifier 14 is biased via a second bias signal $BIAS_2$ provided from the second bias signal generator 20.

In the second mode, the first switch $SW_1$ and the second switch $SW_2$ are closed such that the bias input of the third RF power amplifier is coupled to an output of both the first bias signal generator 18 and the second bias signal generator 20. In the second mode, the first RF power amplifier 12 and the second RF power amplifier 14 are inactive, while the third RF power amplifier 16 is active. Each one of the first bias signal generator 18 and the second bias signal generator 20 provide a portion of a bias signal for the third RF power amplifier 16 in the second mode such that the combined signals from the first bias signal generator 18 and the second bias signal generator 20 provide a third bias signal $BIAS_3$ to a bias input of the third RF power amplifier 16. To do so, only one of the first APT controller 24 and the second APT controller 28 may control both the first set of power converter switches 26 and the second set of power converter switches 30 such that the other one of the first APT controller 24 and the second APT controller 28 is inactive in the second mode.

By using both the first bias signal generator 18 and the second bias signal generator 20 to provide the third bias signal $BIAS_3$ to the third RF power amplifier 16 in the second mode, the first bias signal generator 18 and the second bias signal generator 20 can be optimized for biasing the first RF power amplifier 12 and the second RF power amplifier 14, respectively, allowing them to achieve maximum efficiency in the first mode while still being capable of supporting the third RF power amplifier 16 in the second mode. Accordingly, a separate bias signal generator for the third RF power amplifier 16 is not required, thereby saving space in the RF circuitry 10.

While not shown to avoid obscuring the drawings, control signals for the switching circuitry 22 may be provided by any suitable means, such as by dedicated control circuitry or by a serial interface in the RF circuitry 10.

Figure 2:
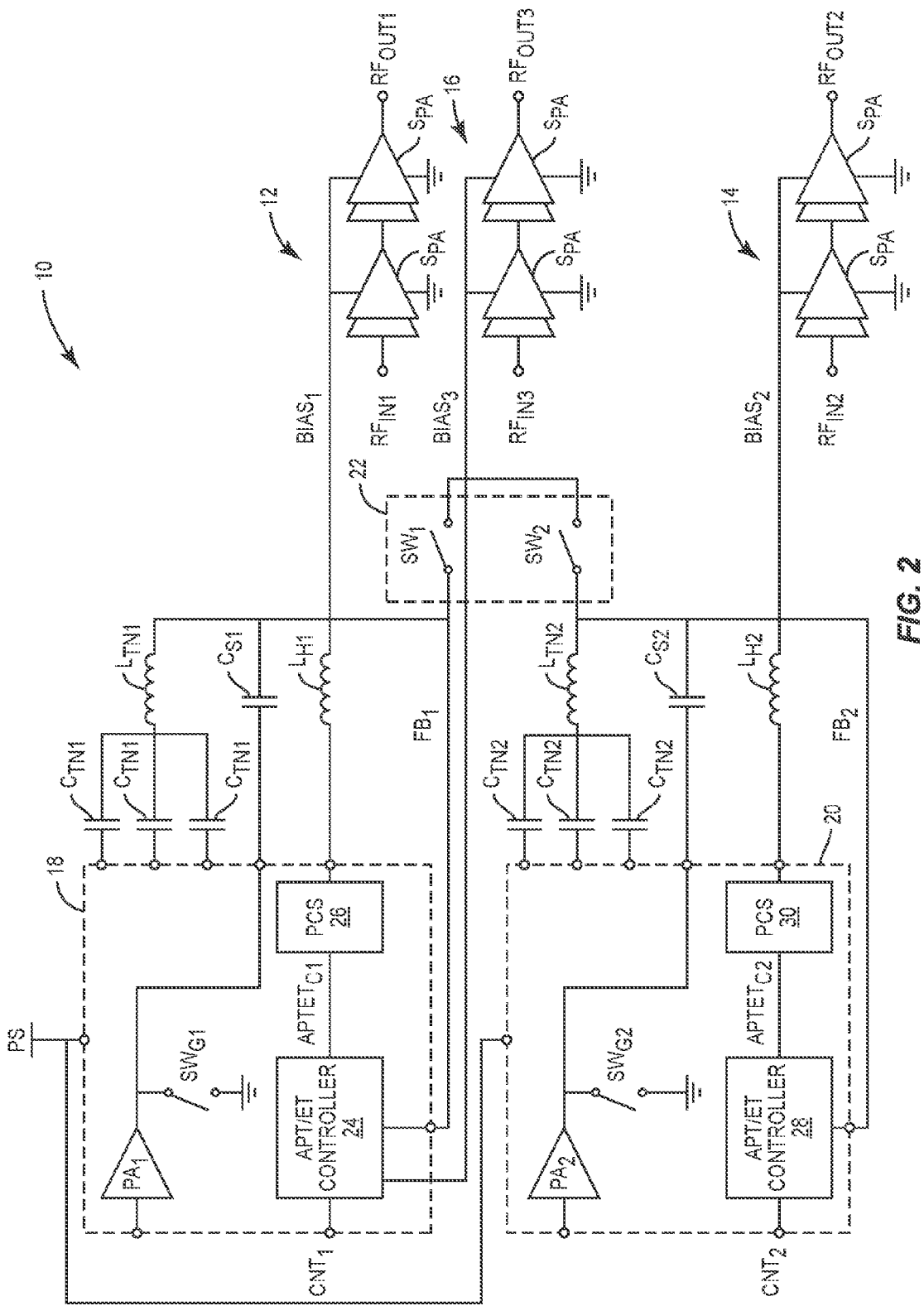
FIG. 2 shows RF circuitry according to one embodiment of the present disclosure.

To fully optimize the efficiency of the RF circuitry 10, it may be desirable for the first bias signal generator 18 and the second bias signal generator 20 to provide envelope tracking (ET) bias signals to the first RF power amplifier 12 and the second RF power amplifier 14. Accordingly, FIG. 2 shows the RF circuitry 10 wherein the first bias signal generator 18 and the second bias signal generator 20 are capable of providing either an APT bias signal or an ET bias signal. The RF circuitry 10 shown in FIG. 2 is substantially similar to that shown in FIG. 1, except that the first APT controller 24 and the second APT controller 28 are APT/ET controllers capable of providing APT/ET control signals $APTET_C$ to the first set of power converter switches 26 and the second set of power converter switches 30, respectively. The first bias signal generator 18 further includes a first parallel amplifier $PA_1$, a first tuning inductor $L_{TN1}$, a first set of tuning capacitors $C_{TN1}$, and a first grounding switch $SW_{G1}$. The first smoothing capacitor $C_{S1}$ is also moved to be parallel with the first holding inductor $L_{H1}$ at the output of the first parallel amplifier $PA_1$. The second bias signal generator 20 further includes a second parallel amplifier $PA_2$, a second tuning inductor $L_{TN2}$, a second set of tuning capacitors $C_{TN2}$, and a second grounding switch $SW_{G2}$. The second smoothing capacitor $C_{S2}$ is also moved to be parallel with the second holding inductor $L_{H2}$ at the output of the second parallel amplifier $PA_2$. Details of the operation of the first bias signal generator 18 and the second bias signal generator 20 are described in detail in U.S. Pat. No. 9,526,693, the contents of which are hereby incorporated by reference in their entirety.

The RF circuitry 10 similarly operates in the first mode and the second mode as discussed above. In the first mode, the first bias signal generator 18 may provide one of an APT bias signal and an ET bias signal to the first RF power amplifier 12 and the second bias signal generator 20 may provide one of an APT bias signal and an ET bias signal to the second RF power amplifier 14. In the second mode, the first bias signal generator 18 and the second bias signal generator 20 both provide an APT bias signal to the third RF power amplifier 16. The first switch $SW_1$ and the second switch $SW_2$ operate as described above with respect to the RF circuitry 10 shown in FIG. 1.

Figure 3:
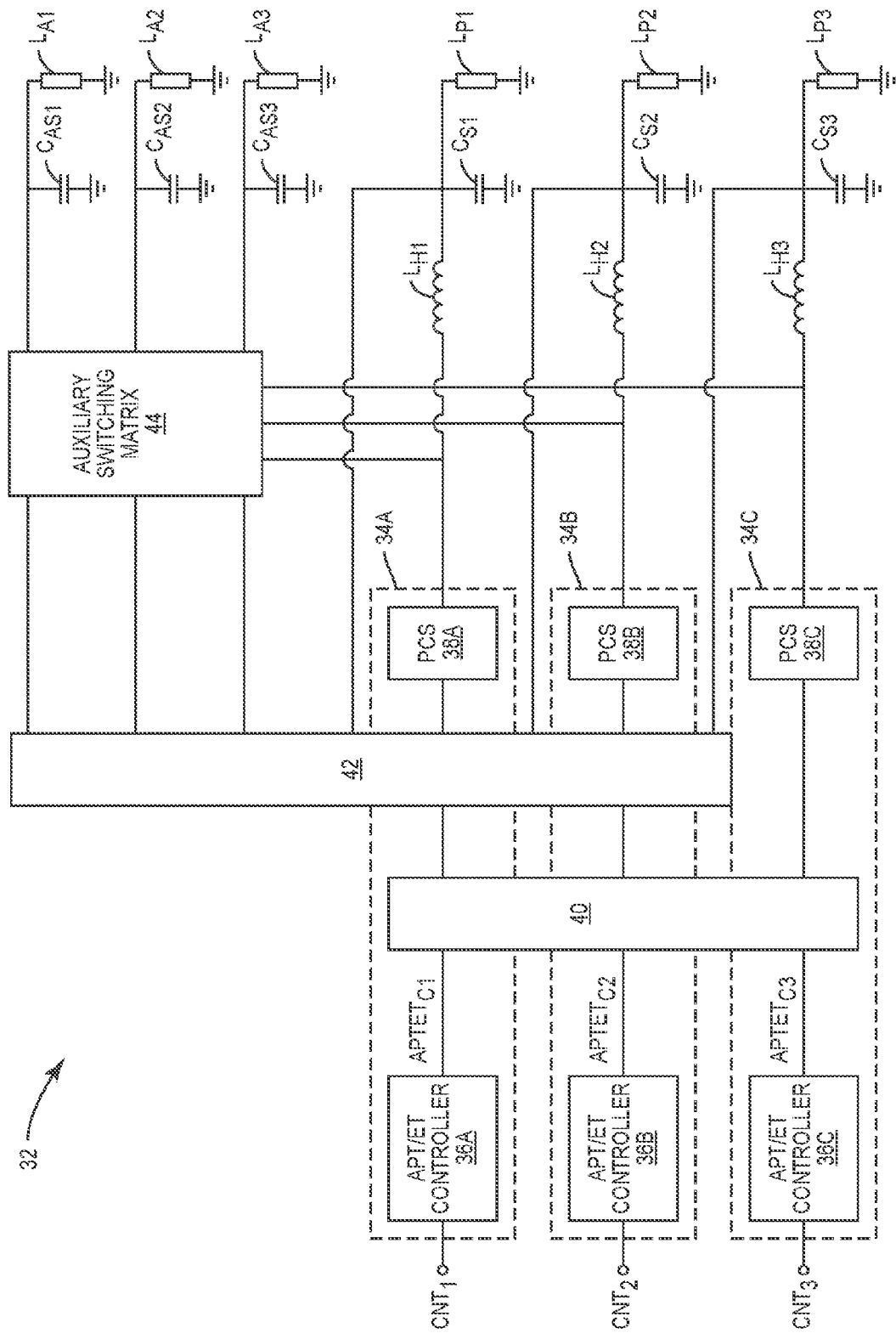
FIG. 3 shows RF circuitry according to one embodiment of the present disclosure.

While the RF circuitry 10 shown above is configured to provide bias signals for three different RF power amplifiers, the present disclosure is not so limited. The principles herein may be applied to provide bias for any number of different RF power amplifiers (referred to with respect to FIG. 3 as loads). In terms of the above figures, the first RF power amplifier $PA_1$ and the second RF power amplifier $PA_2$ may be considered primary loads, as the first bias signal generator 18 and the second bias signal generator 20 are designed for providing bias signals thereto with maximum efficiency. The third RF power amplifier $PA_3$ may be considered an ancillary load, since both the first bias signal generator 18 and the second bias signal generator 20 are required to provide a bias signal thereto. FIG. 3 thus shows RF circuitry 32 including a number of primary loads $L_P$, a number of ancillary loads $L_A$, bias signal generator circuitry, and switching circuitry for facilitating connections between the primary loads $L_P$, the ancillary loads $A_L$, and the bias signal generator circuitry.

A first bias signal generator 34A includes a first APT/ET controller 36A and a first set of power converter switches 38A. A second bias signal generator 34B includes a second APT/ET controller 36B and a second set of power converter switches 38B. A third bias signal generator 34C includes a third APT/ET controller 36C and a third set of power converter switches 38C. Each one of the APT/ET controllers 36 may be connected to any one of the sets of power converter switches 38 via a control signal switching matrix 40 in order to provide APT/ET control signals $APTET_C$ thereto. The APT/ET control signals $APTET_C$ from each one of the APT/ET controllers 36 may be based on a control signal CNT and a feedback signal. The control signal CNT for each one of the APT/ET controllers 36 may be provided from a serial controller (not shown to avoid obscuring the drawings). The feedback signal provided to each one of the APT/ET controllers 36 may be routed via a feedback signal switching matrix 42, allowing the feedback signal to be routed from any desired output in order to increase the flexibility of the RF circuitry 32.

As discussed above, each of the sets of power converter switches 38 is configured to switch power into a holding inductor $L_H$ and a smoothing capacitor $C_S$ in order to deliver power to a desired load. Based on which one of the APT/ET controllers 36 is coupled to the set of power converter switches 38 and thus what APT/ET control signal $APTET_C$ is provided thereto, the output provided will change.

An auxiliary load switching matrix 44 is configured to selectively couple one or more of the auxiliary loads $L_A$ to an output of one or more of the bias signal generators 34 in order to provide a bias signal thereto. As discussed above, each one of the bias signal generators 34 may be designed to provide maximum efficiency for biasing one of the primary loads $L_P$, and thus may not be capable of providing adequate power for biasing one of the auxiliary loads $L_A$. Accordingly, the auxiliary load switching matrix 44 may be configured to couple an output of two or more of the bias signal generators 34 to one of the auxiliary loads $L_A$ and couple a feedback signal from the auxiliary load $L_A$ to an appropriate one of the APT/ET controllers 36 controlling the two or more sets of power converter switches 38. Notably, only one of the APT/ET controllers 36 may be active and control multiple sets of power converter switches 38. Accordingly, any of the primary loads $L_P$ may be simultaneously biased, while at least one of the auxiliary loads $L_A$ may be biased when necessary.

In general, an output from any of the APT/ET controllers 36 may be coupled to an input of any of the sets of power converter switches 38, the output of which may in turn be coupled to a primary load $L_P$ or an auxiliary load $L_A$ in order to provide a bias signal thereto. Accordingly, the RF circuitry 32 provides maximum flexibility for biasing a number of primary loads $L_P$ and auxiliary loads $L_A$ with a minimal number of bias signal generators 34.

The primary loads $L_P$ may be RF power amplifiers configured to amplify RF signals for transmission in one or more of a 3G carrier network and a 4G carrier network. The ancillary loads $L_A$ may be RF power amplifiers configured to amplify RF signals for transmission in a 2G carrier network. The RF circuitry 32 thus supports transmission of signals in 2G carrier networks, 3G carrier networks, and 4G carrier networks with a minimal number of bias signal generators. Accordingly, the RF circuitry 32 may remain compact and thus be implemented in a mobile wireless communications device.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
    a first radio frequency (RF) power amplifier and a second RF power amplifier, each configured to amplify RF signals for transmission in a first carrier network;
    a third RF power amplifier configured to amplify RF signals for transmission in a second carrier network;
    a first bias signal generator and a second bias signal generator, wherein:
        in a first mode, the first bias signal generator provides a bias signal to the first RF power amplifier and the second bias signal generator provides a bias signal to the second RF power amplifier; and
        in a second mode, the first bias signal generator and the second bias signal generator each provide a portion of a bias signal to the third RF power amplifier.

2. The circuitry of claim 1 wherein:
    the first carrier network is one or more of a third generation (3G) carrier network and a fourth generation (4G) carrier network; and
    the second carrier network is a second generation (2G) carrier network.

3. The circuitry of claim 2 wherein:
    the bias signal provided from the first bias signal generator to the first RF power amplifier is one of an average power tracking (APT) bias signal and an envelope tracking (ET) bias signal; and
    the portion of the bias signal provided from the first bias signal generator to the third RF power amplifier is an APT bias signal.

4. The circuitry of claim 3 wherein:
    the bias signal provided from the second bias signal generator to the second RF power amplifier is one of an APT bias signal and an ET bias signal; and
    the bias signal provided from the second bias signal generator to the third RF power amplifier is an APT bias signal.

5. The circuitry of claim 2 wherein power requirements of the first RF power amplifier and the second RF power amplifier are less than half the power requirements of the third RF power amplifier.

6. The circuitry of claim 2 wherein the first bias signal generator and the second bias signal generator each comprise:
    a switching power converter; and
    bias control circuitry configured to operate the switching power converter to provide one of an average power tracking (APT) bias signal and an envelope tracking (ET) bias signal.

7. The circuitry of claim 2 further comprising switching circuitry configured to:
    in the first mode of the first bias signal generator, couple an output of the first bias signal generator to a bias input of the first RF power amplifier;
    in the second mode of the first bias signal generator, couple the output of the first bias signal generator to a bias input of the third RF power amplifier;
    in the first mode of the second bias signal generator, couple an output of the second bias signal generator to a bias input of the second RF power amplifier; and
    in the second mode of the second bias signal generator, couple the output of the second bias signal generator to the bias input of the third RF power amplifier.

8. The circuitry of claim 1 wherein:
    the bias signal provided from the first bias signal generator to the first RF power amplifier is one of an average power tracking (APT) bias signal and an envelope tracking (ET) bias signal; and
    the portion of the bias signal provided from the first bias signal generator to the third RF power amplifier is an APT bias signal.

9. The circuitry of claim 8 wherein:
    the bias signal provided from the second bias signal generator to the second RF power amplifier is one of an APT bias signal and an ET bias signal; and the bias signal provided from the second bias signal generator to the third RF power amplifier is an APT bias signal.

10. The circuitry of claim 1 wherein power requirements of the first RF power amplifier and the second RF power amplifier are less than half the power requirements of the third RF power amplifier.

11. The circuitry of claim 1 wherein the first bias signal generator and the second bias signal generator each comprise:
a switching power converter; and
bias control circuitry configured to operate the switching power converter to provide one of an average power tracking (APT) bias signal and an envelope tracking (ET) bias signal.

12. The circuitry of claim 1 further comprising switching circuitry configured to:
in the first mode of the first bias signal generator, couple an output of the first bias signal generator to a bias input of the first RF power amplifier;
in the second mode of the first bias signal generator, couple the output of the first bias signal generator to a bias input of the third RF power amplifier;
in the first mode of the second bias signal generator, couple an output of the second bias signal generator to a bias input of the second RF power amplifier; and
in the second mode of the second bias signal generator, couple the output of the second bias signal generator to the bias input of the third RF power amplifier.

13. Circuitry comprising:
a plurality of radio frequency (RF) power amplifiers, wherein at least two of the plurality of RF power amplifiers are configured to amplify RF signals for transmission in different carrier networks;
a plurality of bias signal generators each configured to provide a bias signal; and
switching circuitry coupled between the plurality of bias signal generators and the plurality of RF power amplifiers, wherein:
in a first mode, the switching circuitry is configured to couple a first one of the plurality of bias signal generators to a first one of the plurality of RF amplifiers such that a bias signal from the first one of the plurality of bias signal generators is provided to the first one of the plurality of RF amplifiers; and
in a second mode, the switching circuitry is configured to couple at least two of the plurality of bias signal generators to a second one of the plurality of RF power amplifiers such that each of the at least two of the plurality of bias signal generators provides a portion of a bias signal to the second one of the plurality of RF power amplifiers.

14. The circuitry of claim 13 wherein:
the first one of the plurality of RF power amplifiers is configured to amplify RF signals for transmission in one of a third generation (3G) carrier network and a fourth generation (4G) carrier network; and
the second one of the plurality of RF power amplifiers is configured to amplify RF signals for transmission in a second generation (2G) carrier network.

15. The circuitry of claim 14 wherein:
the bias signal provided from the first one of the plurality of bias signal generators to the first one of the plurality of RF power amplifiers is one of an average power tracking (APT) bias signal and an envelope tracking (ET) bias signal; and
the portion of the bias signal provided from each of the at least two of the plurality of bias signal generators to the second one of the plurality of RF power amplifiers is an APT bias signal.

16. The circuitry of claim 14 wherein power requirements of the first one of the plurality of RF power amplifiers are less than half the power requirements of the second one of the plurality of RF power amplifiers.

17. The circuitry of claim 14 wherein each of the plurality of bias signal generators comprise:
a switching power converter; and
bias control circuitry configured to operate the switching power converter to provide one of an average power tracking (APT) bias signal and an envelope tracking (ET) bias signal.

18. The circuitry of claim 13 wherein:
the bias signal provided from the first one of the plurality of bias signal generators to the first one of the plurality of RF power amplifiers is one of an average power tracking (APT) bias signal and an envelope tracking (ET) bias signal; and
the portion of the bias signal provided from each of the at least two of the plurality of bias signal generators to the second one of the plurality of RF power amplifiers is an APT bias signal.

19. The circuitry of claim 18 wherein power requirements of the first one of the plurality of RF power amplifiers are less than half the power requirements of the second one of the plurality of RF power amplifiers.

20. The circuitry of claim 13 wherein the each of the plurality of bias signal generators comprise:
a switching power converter; and
bias control circuitry configured to operate the switching power converter to provide one of an average power tracking (APT) bias signal and an envelope tracking (ET) bias signal.

* * * * *